(12) United States Patent
Huang et al.

(10) Patent No.: US 8,952,501 B2
(45) Date of Patent: Feb. 10, 2015

(54) CHIP PACKAGE AND METHOD FOR FORMING THE SAME

(71) Applicant: Xintec Inc., Jhongli (TW)

(72) Inventors: Yu-Lung Huang, Daxi Township (TW); Chao-Yen Lin, New Taipei (TW); Wei-Luen Suen, New Taipei (TW); Chien-Hui Chen, Zhongli (TW)

(73) Assignee: Xintec, Inc., Jhongli (TW)

( * ) Notice: Subject to any disclaimer, the term of this patent is extended or adjusted under 35 U.S.C. 154(b) by 0 days.

(21) Appl. No.: 13/950,101

(22) Filed: Jul. 24, 2013

(65) Prior Publication Data

US 2013/0307125 A1    Nov. 21, 2013

Related U.S. Application Data

(63) Continuation-in-part of application No. 13/105,775, filed on May 11, 2011, now Pat. No. 8,507,321.

(60) Provisional application No. 61/333,459, filed on May 11, 2010.

(51) Int. Cl.
*H01L 29/06* (2006.01)
*H01L 23/498* (2006.01)
(Continued)

(52) U.S. Cl.
CPC .......... *H01L 23/49805* (2013.01); *H01L 24/95* (2013.01); *H01L 23/3121* (2013.01); *H01L 21/561* (2013.01); *H01L 21/6835* (2013.01); *H01L 24/05* (2013.01); *H01L 24/48* (2013.01); *H01L 2221/68327* (2013.01); *H01L 2221/6834* (2013.01); *H01L 2221/68381* (2013.01); *H01L 2224/0401* (2013.01); *H01L 2224/04042* (2013.01); *H01L 2224/05558* (2013.01); *H01L 2224/16227* (2013.01); *H01L 2224/48091* (2013.01); *H01L 2224/48227* (2013.01); *H01L 2924/14* (2013.01); *H01L 2924/1461* (2013.01); *H01L 24/16* (2013.01); (Continued)

(58) Field of Classification Search
USPC ............. 438/51, 55, 109, 113, 107, 617, 612; 257/623, 738, E23.069, E21.499, 774
See application file for complete search history.

(56) References Cited

U.S. PATENT DOCUMENTS 7,199,345 B1   4/2007 Meisel et al.
7,271,024 B2 * 9/2007 Huang et al. ................. 438/51
(Continued)

FOREIGN PATENT DOCUMENTS

CN    101276820    10/2008
CN    102244047    11/2011

*Primary Examiner* — Julio J Maldonado
*Assistant Examiner* — Robert Bachner
(74) *Attorney, Agent, or Firm* — Liu & Liu (57) ABSTRACT

An embodiment of the invention provides a chip package which includes: a semiconductor substrate having an upper surface and a lower surface; a device region or sensing region defined in the semiconductor substrate; a conducting pad located on the upper surface of the semiconductor substrate; at least two recesses extending from the upper surface towards the lower surface of the semiconductor substrate, wherein sidewalls and bottoms of the recesses together form a sidewall of the semiconductor substrate; a conducting layer electrically connected to the conducting pad and extending from the upper surface of the semiconductor substrate to the sidewall of the semiconductor substrate; and an insulating layer located between the conducting layer and the semiconductor substrate.

27 Claims, 12 Drawing Sheets

(51) Int. Cl.
*H01L 23/00* (2006.01)
*H01L 23/31* (2006.01)
*H01L 21/56* (2006.01)
*H01L 21/683* (2006.01)

(52) U.S. Cl.
CPC ........... *H01L 2224/05624* (2013.01); *H01L 2224/05644* (2013.01); *H01L 2224/05647* (2013.01); *H01L 2224/05655* (2013.01); *H01L 2224/05669* (2013.01); *H01L 2224/94* (2013.01); *H01L 2224/05572* (2013.01); *H01L 2924/10253* (2013.01); *H01L 2924/12041* (2013.01); *H01L 2224/16225* (2013.01)

USPC .......................................... 257/623; 438/113

(56) References Cited

U.S. PATENT DOCUMENTS

| | | | |
|---|---|---|---|
| 7,424,136 | B2 * | 9/2008 | Setlak et al. .................. 382/126 |
| 8,736,080 | B2 | 5/2014 | Arnold et al. |
| 2006/0270089 | A1 | 11/2006 | Huang et al. |
| 2008/0001241 | A1 | 1/2008 | Tuckerman et al. |
| 2009/0283845 | A1 * | 11/2009 | Chou .......................... 257/417 |
| 2013/0285240 | A1 | 10/2013 | Last et al. |
| 2013/0307125 | A1 | 11/2013 | Huang et al. |

\* cited by examiner

CHIP PACKAGE AND METHOD FOR FORMING THE SAME

CROSS REFERENCE TO RELATED APPLICATIONS

This application is a Continuation-In-Part of pending U.S. patent application Ser. No. 13/105,775, filed May 11, 2011 and entitled "Chip package and method for forming the same", which claims the benefit of U.S. Provisional Application No. 61/333,459, filed on May 11, 2010, the entirety of which are incorporated by reference herein.

BACKGROUND OF THE INVENTION

1. Field of the Invention

The present invention relates to a chip package and forming method thereof, and in particular relates to a chip package of a sensing chip.

2. Description of the Related Art

Conventional manufacturing processes of chip packages concern a plurality of patterning processes and material deposition processes, which not only cost a lot, but also require long processing time.

Therefore, a simplified and fast chip packaging technique is desired.

BRIEF SUMMARY OF THE INVENTION

An embodiment of the invention provides a chip package which includes: a semiconductor substrate having an upper surface and a lower surface; a device region or sensing region defined in the semiconductor substrate; a conducting pad located on the upper surface of the semiconductor substrate; at least two recesses extending from the upper surface towards the lower surface of the semiconductor substrate, wherein sidewalls and bottoms of the recesses together form a sidewall of the semiconductor substrate; a conducting layer electrically connected to the conducting pad and extending from the upper surface of the semiconductor substrate to the sidewall of the semiconductor substrate; and an insulating layer located between the conducting layer and the semiconductor substrate.

An embodiment of the invention provides a method for forming a chip package, which includes: providing a semiconductor substrate having an upper surface and a lower surface, wherein the semiconductor substrate comprises at least a device region or sensing region, and at least a conducting pad is disposed on the upper surface of the semiconductor substrate; forming at least two recesses in the semiconductor substrate, wherein sidewalls and bottoms of the recesses together form a sidewall of the semiconductor substrate; forming an insulating layer overlying the upper surface of the semiconductor substrate and within the recess; forming a conducting layer overlying the insulating layer, wherein the conducting layer is electrically connected to the conducting pad and extends from the upper surface of the semiconductor substrate to the sidewall of the semiconductor substrate; and dicing the semiconductor substrate to form a plurality of separate chip packages.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a sensing chip. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power IC chips.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

FIGS. 1A-1D are cross-sectional views showing the steps of forming a chip package according to an embodiment of the present invention.

Figure 1A:
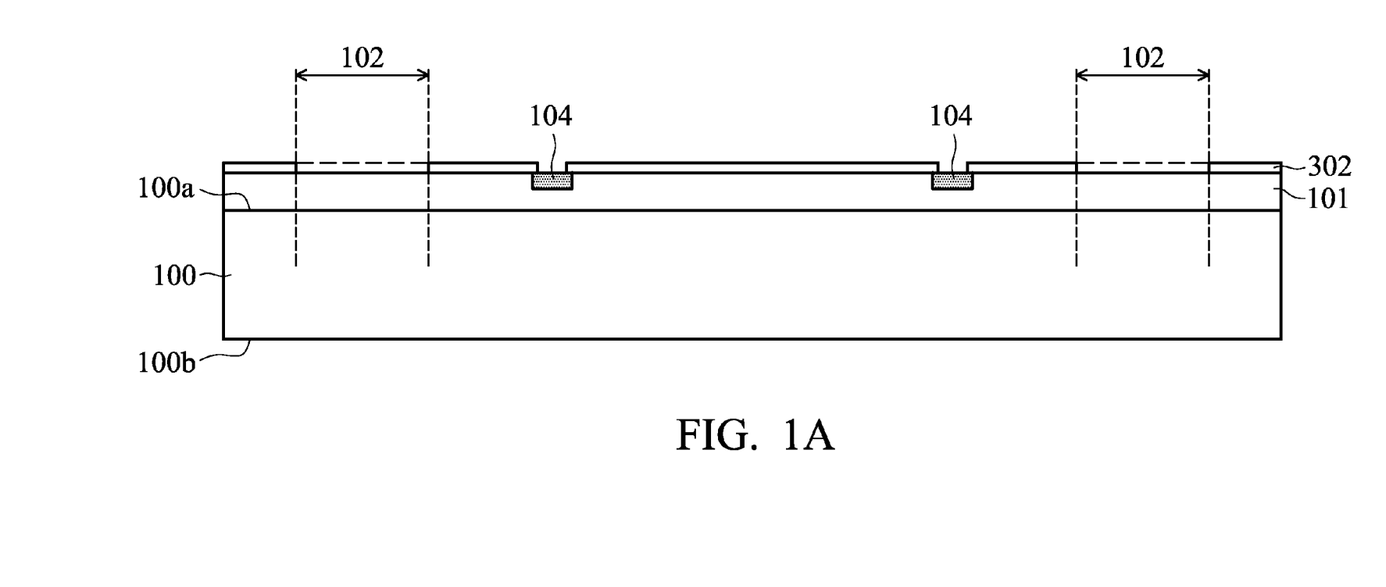
FIGS. 1A-1D are cross-sectional views showing the steps of forming a chip package in accordance with an embodiment of the present invention.

As shown in FIG. 1A, a semiconductor substrate 100 is provided, which includes an upper surface 100a and a lower surface 100b. The semiconductor substrate 100 is, for example, a silicon substrate. In one embodiment, the semiconductor substrate 100 is a silicon wafer which is suitable for the proceeding of a wafer-level packaging.

As shown in FIG. 1A, a device region or sensing region 102 is defined in the semiconductor substrate 100. Electronic elements may be formed in the device region or sensing region 102. In one embodiment, the semiconductor substrate 100 includes a plurality of device regions or sensing regions 102 therein. In one embodiment, the device region or sensing region 102 is, for example, a sensing region such as a fingerprint recognition region. The electronic elements in the device region or sensing region 102 may be disposed on the upper surface 100a of the semiconductor substrate 100. In one embodiment, the electronic elements in the device region or sensing region 102 may be partially formed above the upper surface 100a of the semiconductor substrate 100. Alternatively, in another embodiment, the electronic elements in the device region or sensing region 102 is completely formed in the semiconductor substrate 100 and exposed at the upper surface 100a thereof.

As shown in FIG. 1A, a dielectric layer 101 and a conducting pad 104 may be formed on the upper surface 100a of the semiconductor substrate 100. Typically, the conducting pad 104 is electrically connected to the electronic elements in the device region or sensing region 102 through an interconnection (not shown) formed in the dielectric layer 101. In one embodiment, a passivation layer 302 may be formed on the upper surface 100a of the substrate 100. The passivation layer 302 may be patterned such that the device region or sensing region 102 and the conducting pad 104 are exposed. The passivation layer 302 may include (but is not limited to) a nitride, oxide, oxynitride, or combinations thereof. In another embodiment, the passivation layer 302 on the device region or sensing region 102 may be remained without being removed. Thus, a dotted line is used to illustrate the passivation layer 302 which may be or not be on the device region or sensing region 102.

Figure 1B:
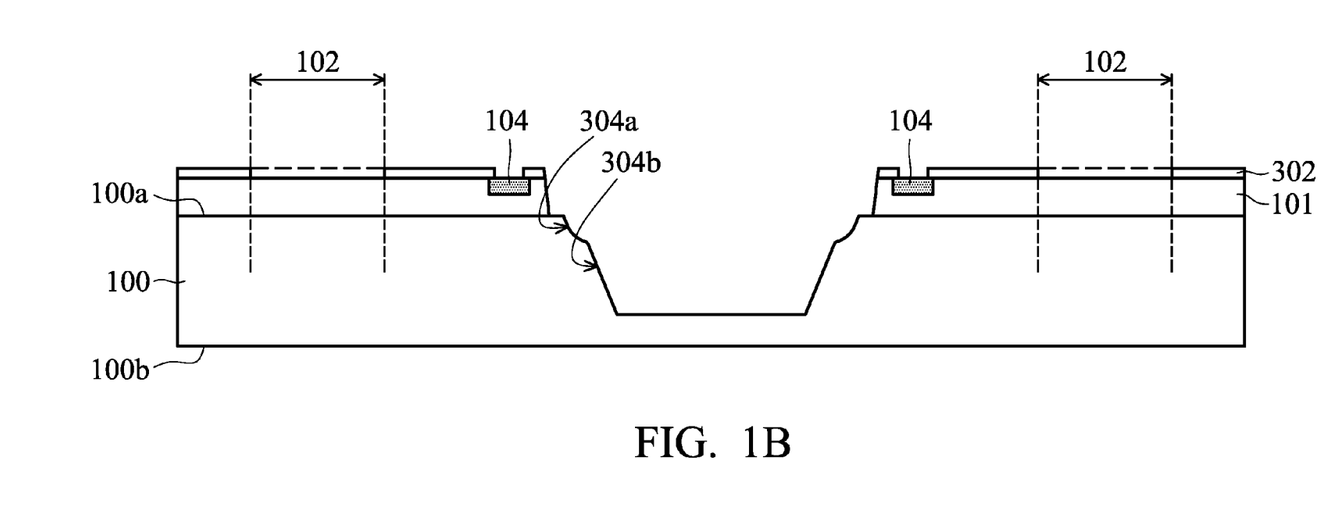

Next, as shown in FIG. 1B, the passivation layer 302 and the dielectric layer 101 may be patterned to expose the semiconductor substrate 100 thereunder. In one embodiment, an etching process is applied to remove a portion of the passivation layer 302 and the dielectric layer 101. The etching process may include a dry etching process, wet etching process, or combinations thereof. After the etching process is performed, a portion of the semiconductor substrate 100 may be removed.

Figure 3A:
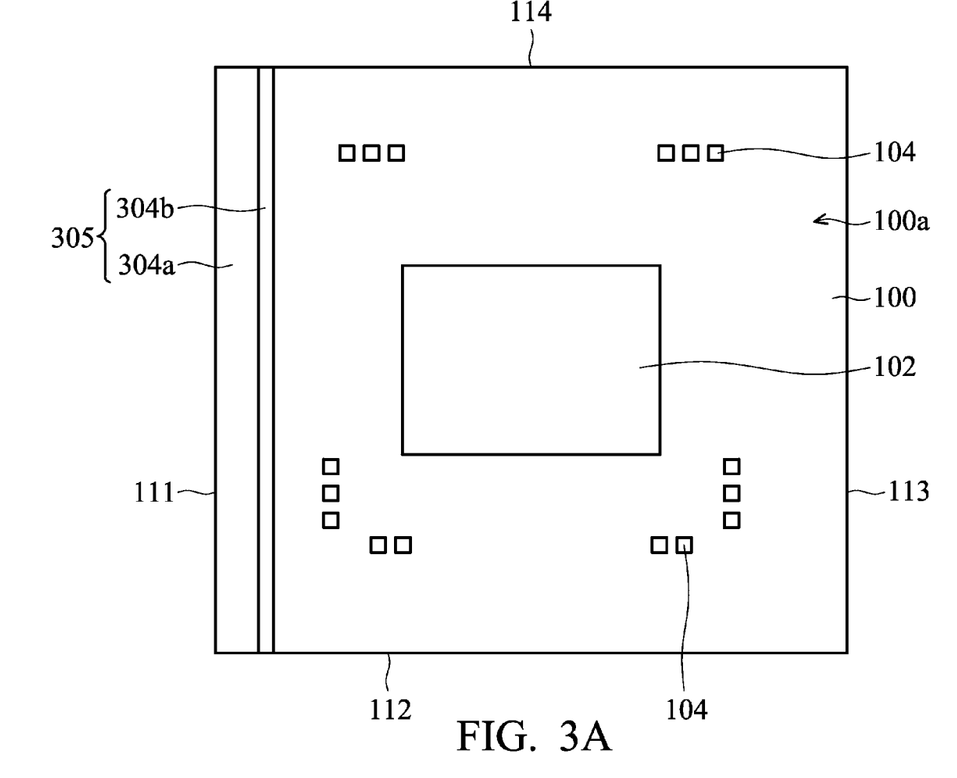
FIGS. 3A-3E are top views showing chip packages in accordance with embodiments of the present invention.

Then, as shown in FIG. 1B, a recess (or notch) 304a is formed, which extends along a direction from the upper surface 100a towards the lower surface 100b of the semiconductor substrate 100. In one embodiment, the semiconductor substrate 100 may be optionally thinned before the recess 304a is formed. In one embodiment, a portion of the substrate 100 is removed from the upper surface 100a by using, for example, a patterning process including a photolithography process and an etching process such that the recess 304a is formed. Then, another portion of the substrate 100 may be further removed by using, for example, a patterning process including a photolithography process and an etching process such that a recess (or notch) 304b is formed. The recess 304b extends along a direction from the bottom of the recess 304a towards the lower surface 100b of the semiconductor substrate 100. In the embodiment, the recesses 304a and 304b connect with each other to form a recess channel 305 extending to two corners of the upper surface 100a of the semiconductor substrate 100, as shown in FIG. 3A.

Embodiments of the invention are not limited thereto. In another embodiment, more recesses may be formed in the semiconductor substrate 100. Sidewalls and bottoms of the recesses may form a sidewall of the semiconductor substrate 100. In addition, sidewalls of the recesses such as the recess 304a and/or the recess 304b may be perpendicular to the upper surface 100a of the semiconductor substrate 100 or incline towards the upper surface 100a of the semiconductor substrate 100. Further, the bottom of the recess 304a and/or the bottom of the recess 304b are not limited to be parallel to the upper surface 100a of the semiconductor substrate 100.

Figure 1C:
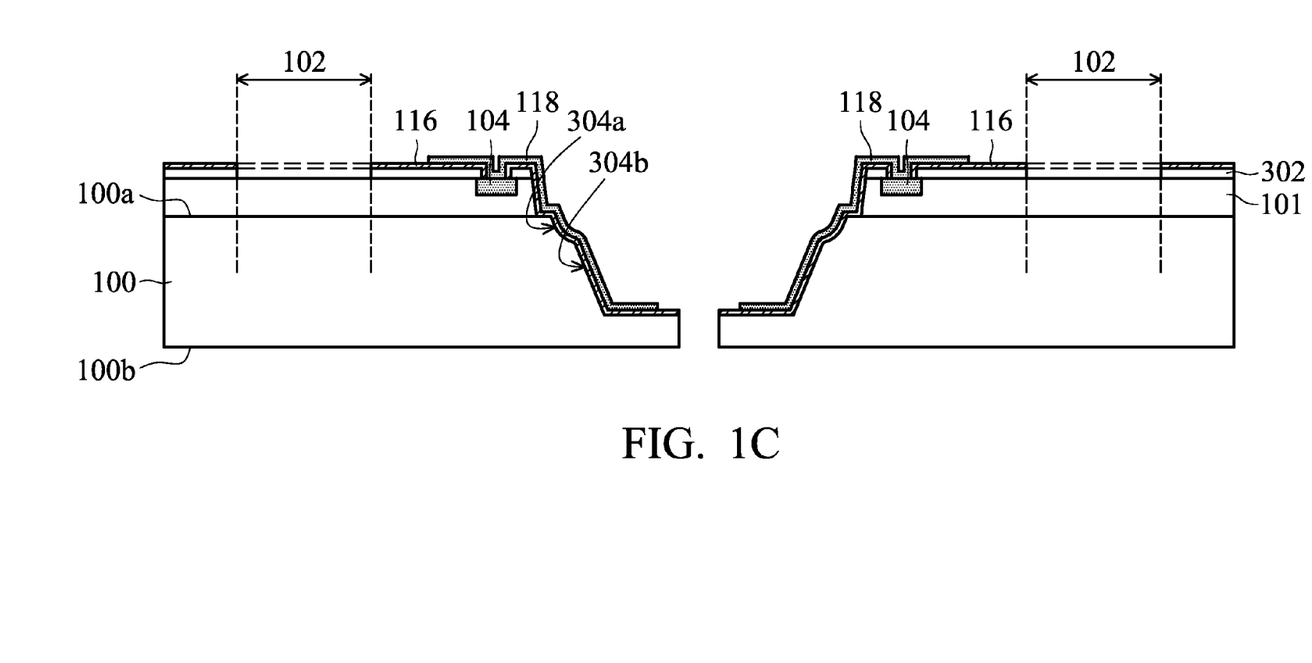

Then, as shown in FIG. 1C, an insulating material is deposited overlying the upper surface 100a and a sidewall and a bottom of the recesses 304a and 304b and is patterned to be an insulating layer 116. In one embodiment, the insulating layer 116 may has an opening exposing the device region or sensing region 102. In another embodiment, the insulating layer 116 may cover the device region or sensing region 102. Thus, a dotted line is used to illustrate the insulating layer 116 which may be or not be on the device region or sensing region 102.

Then, a patterned conducting layer 118 is formed overlying the insulating layer 116. In one embodiment, the insulating layer 116 may be (but is not limited to) an oxide, nitride, oxynitride, or combinations thereof formed by using a chemical vapor deposition process. The patterned conducting layer 118 may include copper, aluminum, nickel, gold, platinum, or combinations thereof.

As shown in FIG. 1C, the conducting layer 118 is electrically connected to the conducting pad 104 and extends from the upper surface 100a of the semiconductor substrate 100 to the sidewalls and the bottoms of the recesses 304a and 304b.

Next, as shown in FIG. 1C, in one embodiment, the semiconductor substrate 100 is diced along predetermined scribe lines (not shown) of the semiconductor substrate 100 to form a plurality of separate chip packages. Because the conducting layer 118, electrically connected to the conducting pad 104, extends overlying a sidewall of the chip package (that is, extend from the upper surface 100a of the semiconductor substrate 100 to a sidewall of the semiconductor substrate 100), the conducting path may be led downwardly from the upper surface 100a of the semiconductor substrate 100 through the sidewall.

Figure 1D:
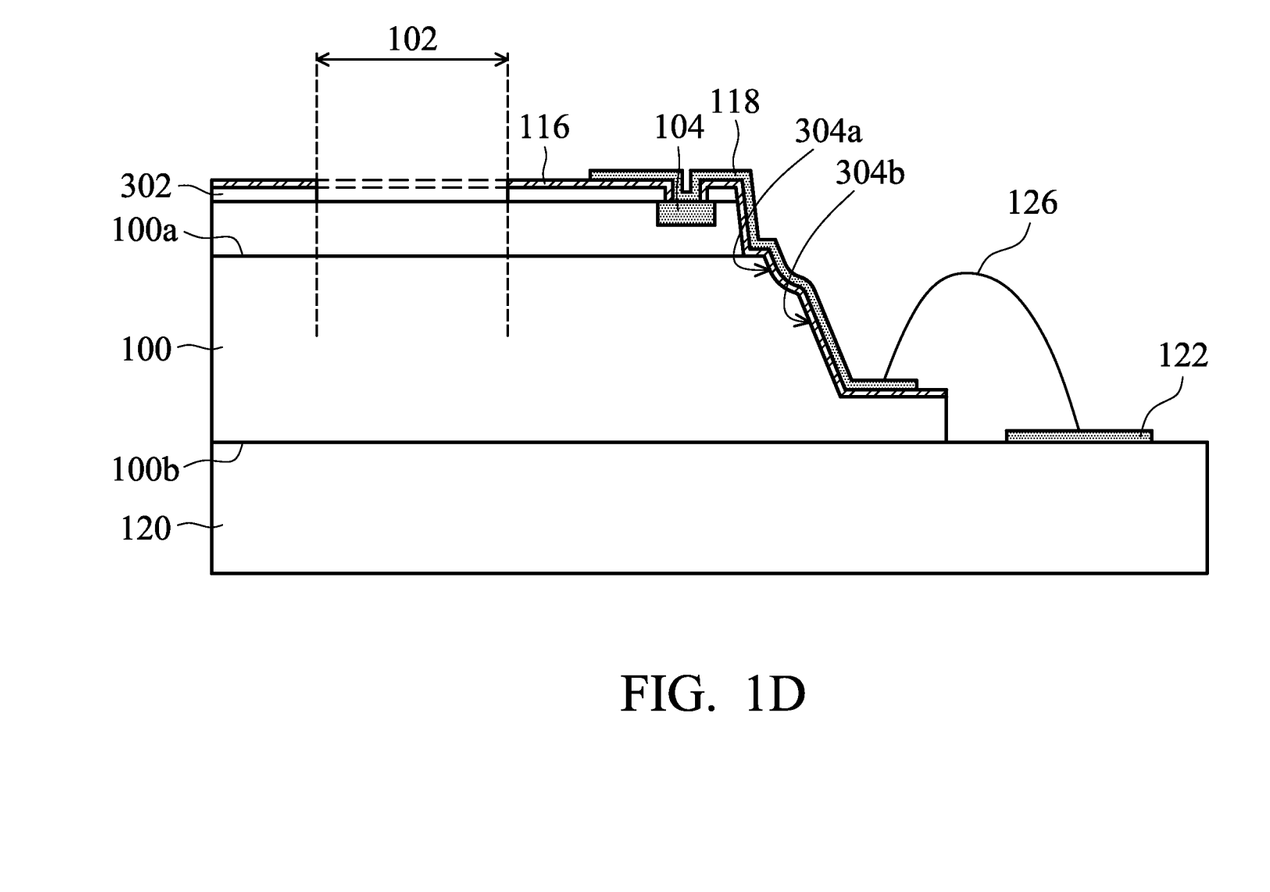

As shown in FIG. 1D, in one embodiment, the formed chip package may be further disposed overlying a circuit board 120. In one embodiment, the circuit board 120 includes a contact pad 122 thereon, which is electrically connected to wires in the circuit board 120 and serves as a contact point with the device region or sensing region 102 in the chip package. As shown in the embodiment in FIG. 1D, a conducting structure such as a bonding wire 126 is formed between the contact pad 122 on the circuit board 120 and the conducting layer 118 located on the sidewall and/or the bottom of the recesses, such as the recess 304b, formed in the semiconductor substrate 100.

The conducting structure such as the bonding wire 126 is formed between the contact pad 122 and the conducting layer 118 located on a relatively low portion of the semiconductor substrate 100. Thus, the conducting structure such as the bonding wire 126 may be substantially lower than the upper surface 100a of the semiconductor substrate 100. The entire height of the formed chip package may be significantly reduced.

Embodiments of the invention are not limited thereto. For example, FIGS. 2A-2C are cross-sectional views showing chip packages in accordance with embodiments of the present invention, wherein same or similar reference numbers are used to designate same or similar elements.

Figure 2A:
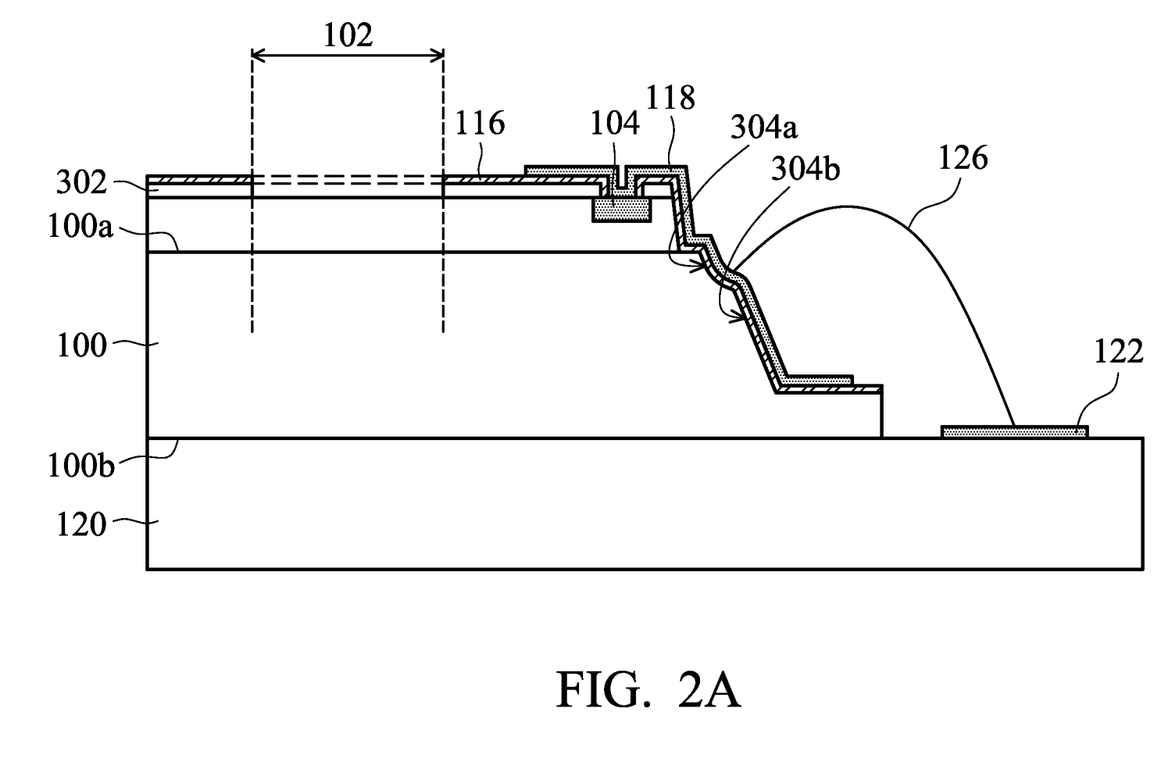
FIGS. 2A-2C are cross-sectional views showing chip packages in accordance with embodiments of the present invention.
Figure 2B:
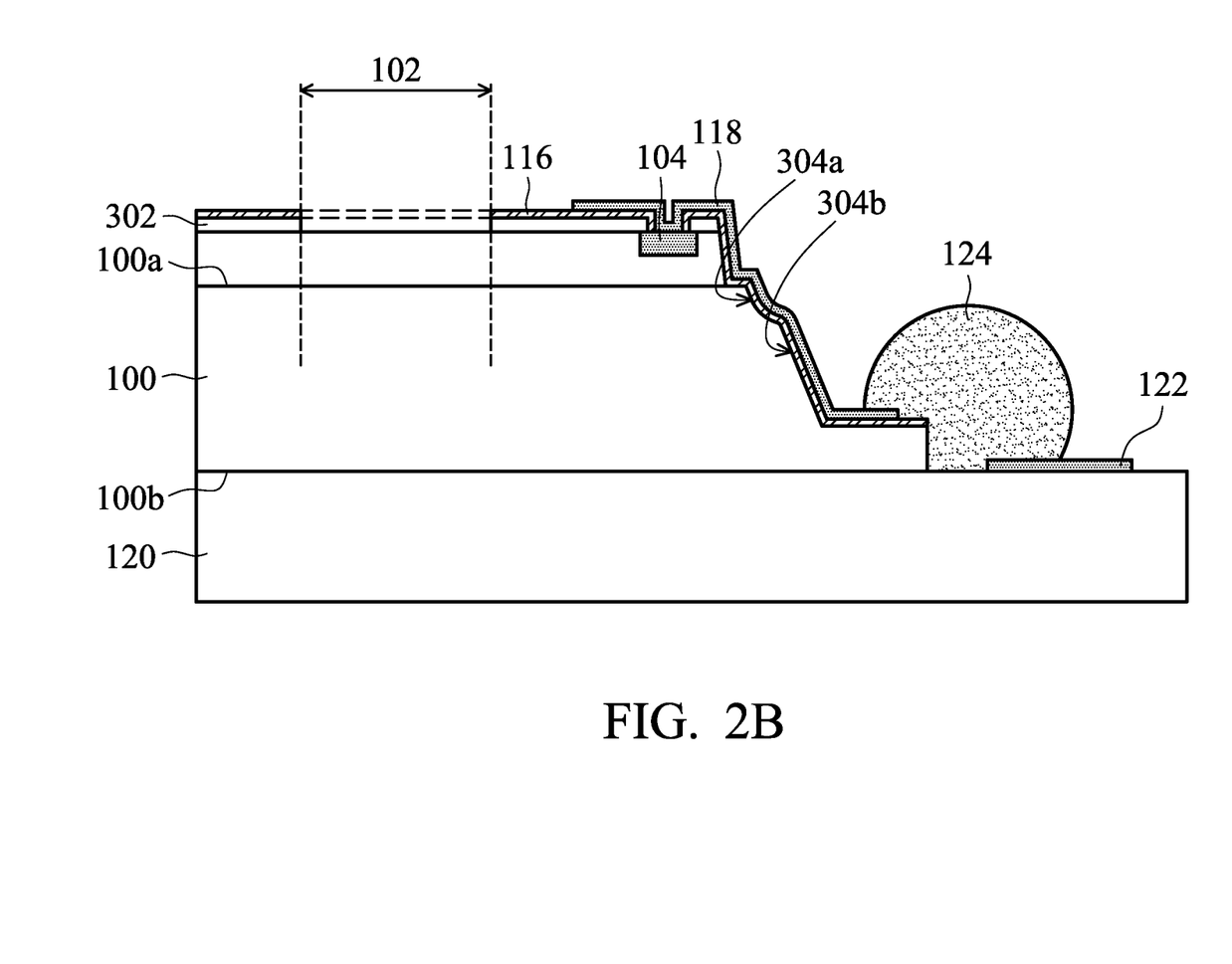
Figure 2C:
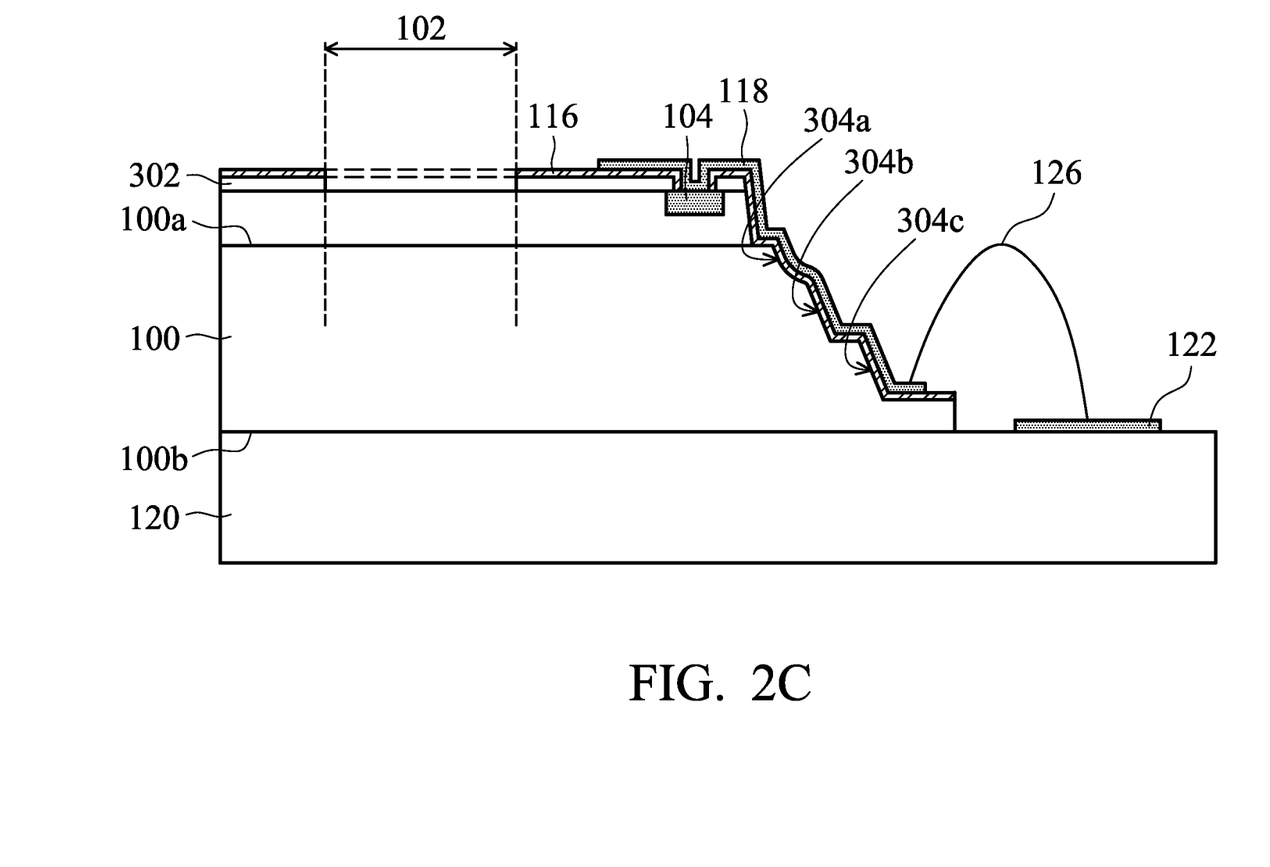

As shown in FIG. 2A, the sidewall of the recess 304b inclines towards the upper surface 100a of the semiconductor substrate 100. In this case, the reliability of the conducting layer 118 formed on the sidewall of the recess 304b may be improved. In addition, the conducting structure such as the bonding wire 126 may be formed between the contact pad 122 on the circuit board 120 and the conducting layer 118 located on the sidewall and/or the bottom of the recess 304a. In another embodiment, more than two recesses may be formed in the semiconductor substrate 100 to form a "step-like" sidewall. The conducting structure such as the bonding wire 126 may be in directly contact with the conducting layer 118 located on the sidewall and/or the bottom of any one of the recesses, as shown in FIG. 2C.

It should be appreciated that embodiments of the invention are not limited to adopt the bonding wire as the conducting structure connecting the circuit board and the chip. In another embodiment, another conducting structure such as a conducting layer, conducting bump, solder ball, or solder wire may be adopted to replace the bonding wire 126. For example, in the embodiment shown in FIG. 2B, a solder ball 124 is used to replace the bonding wire 126. Thus, any conducting structure suitable for forming the conducting path between the contact pad 122 and the conducting layer 118 is within the scope of the embodiments of the present invention.

FIGS. 3A-3E are top views showing chip packages in accordance with some embodiments of the present invention, wherein same or similar reference numbers are used to designate same or similar elements.

Figure 3B:
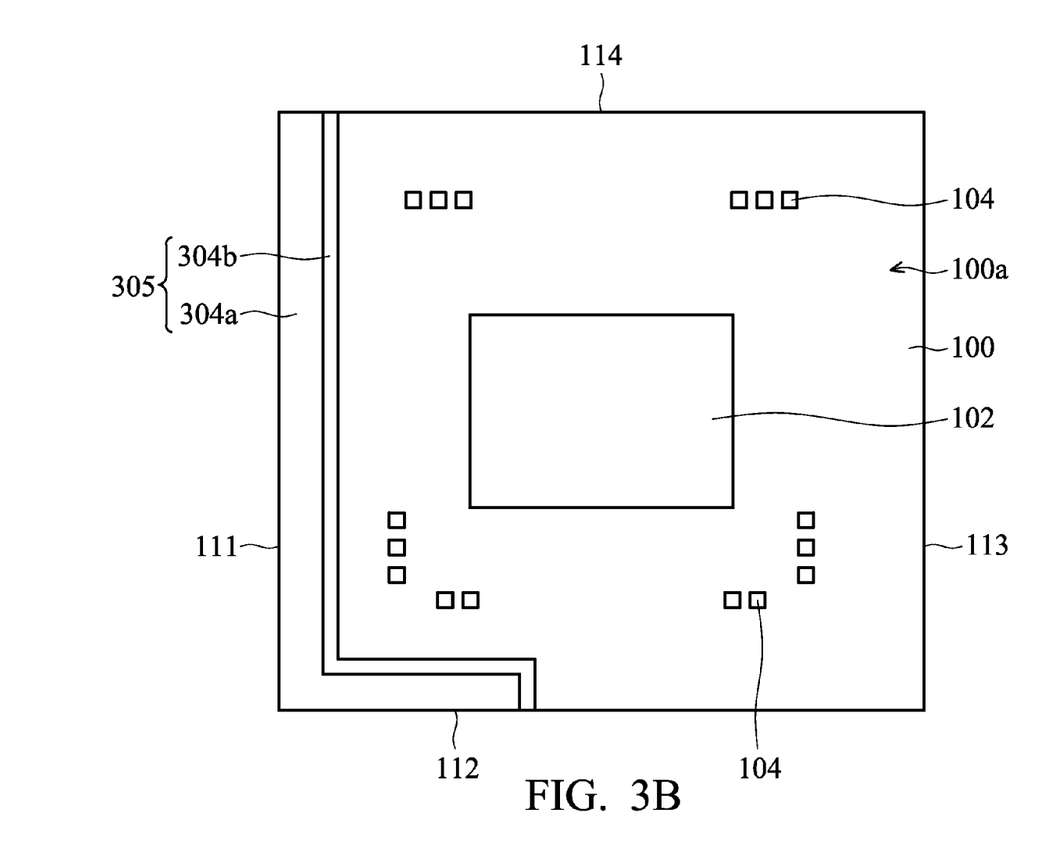
Figure 3C:
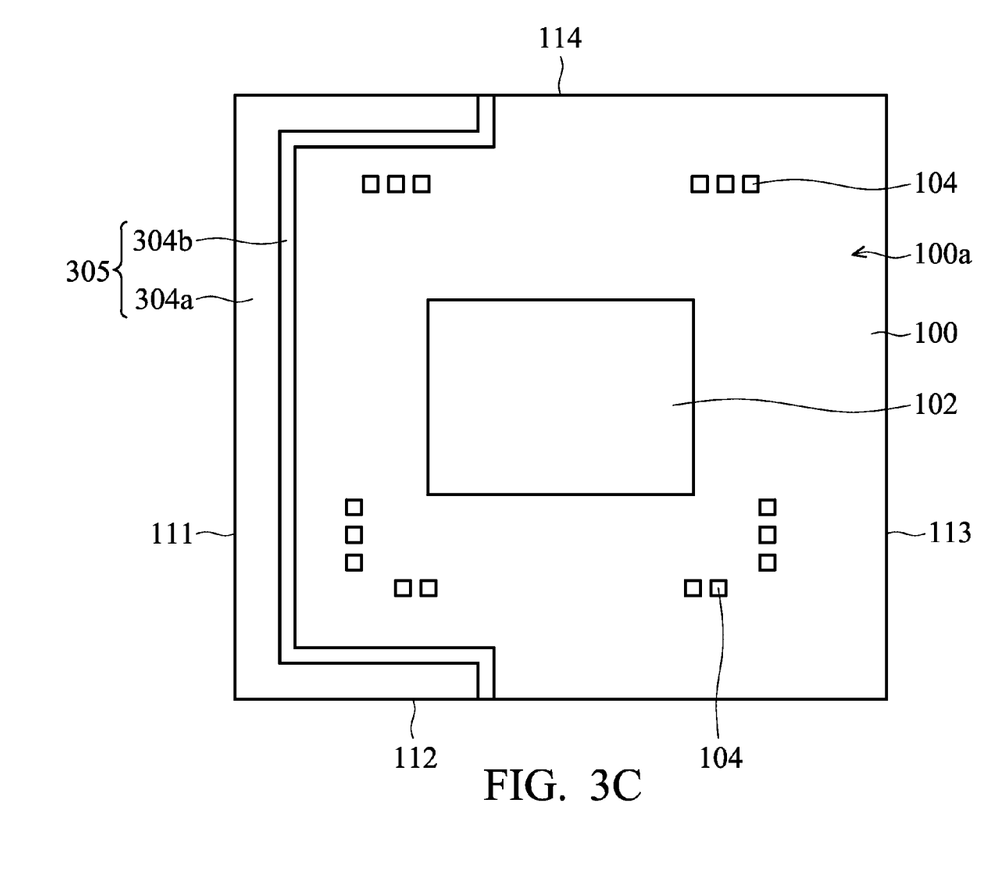

As shown in FIG. 3A, the recesses 304a and 304b extend across an entire length of one side 111 of the semiconductor substrate 100. While FIG. 3A shows that both recesses 304a and 304b extend over the full length of the side 111, in some embodiments, only the recess 304a (lower recess) extends across the full length of the side 111. FIG. 3B shows a variant embodiment where the recess 304a further extends along at least a partial length of an adjacent side 112. FIG. 3C shows another embodiment where the recess 304a further extends along at least a partial length of two adjacent sides 112 and 114. In other embodiments, the recess 304a may extend continuously across the entire length of two, three or even four sides of the semiconductor substrate 100.

Figure 3D:
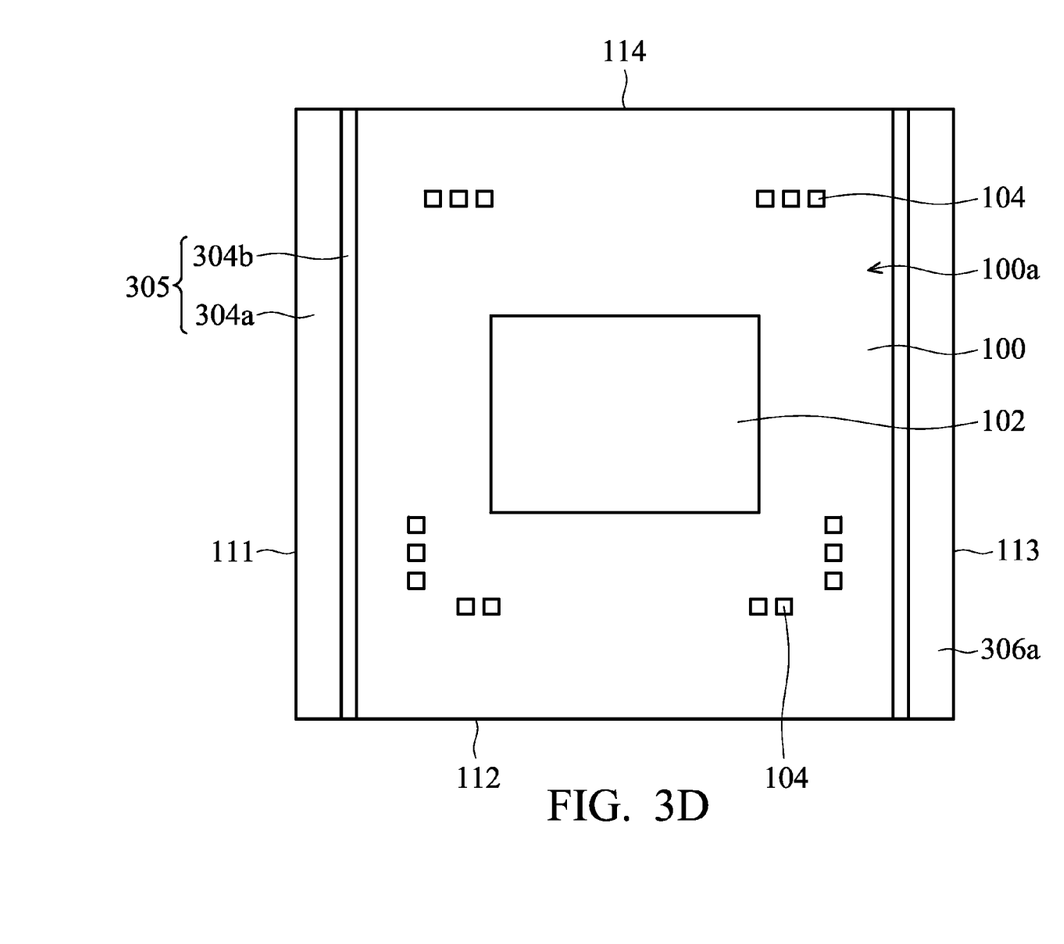
Figure 3E:
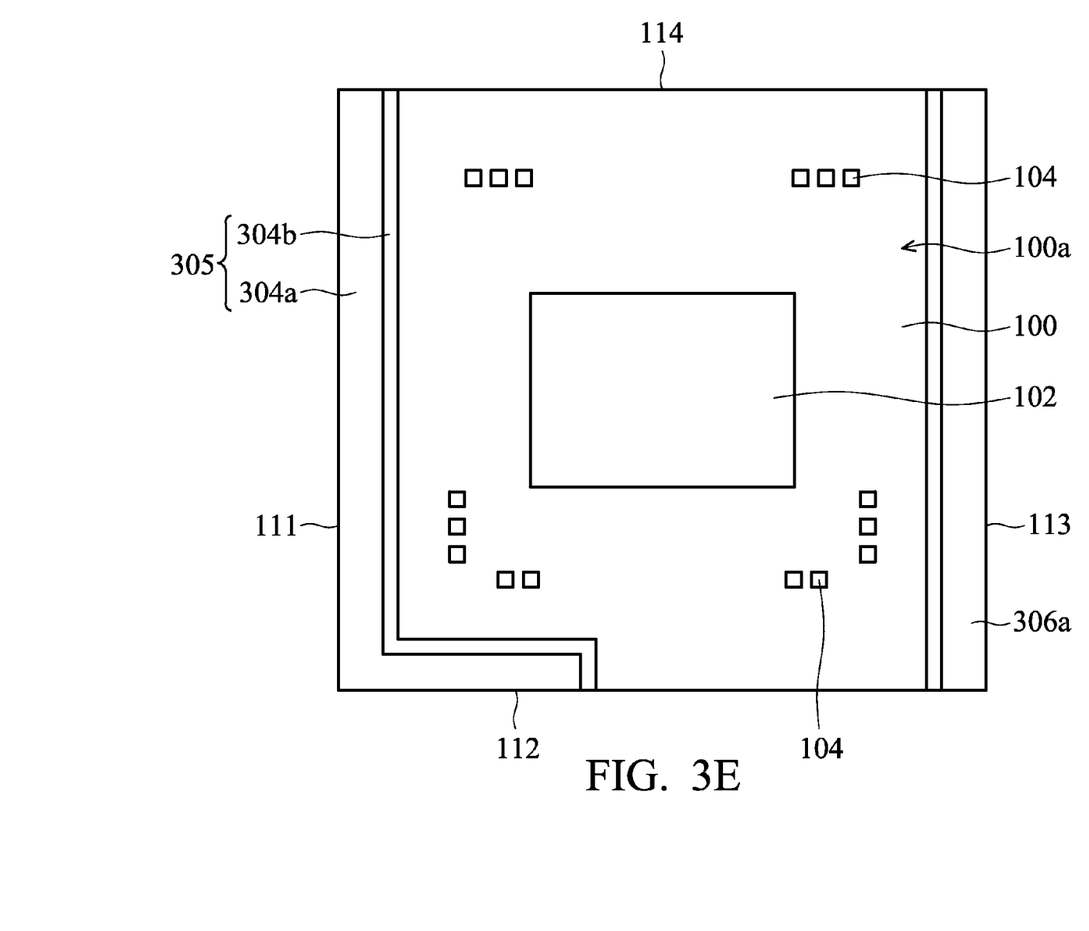

As shown in FIG. 3D, two individual recesses 304a and 306a are formed at opposite sides 111 and 113 of the semiconductor substrate 100. Each of the recesses 304a and 306a respectively extends across an entire length of the opposite sides 111 and 113 of the semiconductor substrate 100. Similarly, each of the recesses 304a and 306a may further extend to one or two adjacent sides. For example, as shown in FIG. 3E, the recess 304a further extends along a partial length of an adjacent side 112. Therefore, although not shown in the figures, those skilled in the art will appreciate that each of recesses 304a and 306a may have other configurations as long as the recess extends across a full length or width of one side of the semiconductor substrate 100.

In the embodiment of the invention, a recess is formed on a front surface of the chip (that is, a same side that the device region or sensing region is formed on) and a conducting layer electrically connecting the device region or sensing region is formed along a sidewall of the recess. The desired conducting wire may be successfully formed and the required patterning process steps of the chip packaging process may be largely reduced. Thus, fabrication time and costs are significantly reduced. In addition, the entire height of the formed chip package may be significantly reduced.

Moreover, the recess spanning over the entire width or length of the semiconductor substrate 100 allows greater flexibility in routing output signals of the chip package.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
a substrate having an upper surface and a lower surface;
a device region or sensing region defined in the substrate;
a conducting pad located on the upper surface of the substrate;
at least two recesses comprising a first recess and a second recess under the first recess, extending from the upper surface towards the lower surface of the substrate, wherein sidewalls and bottoms of the recesses together form a sidewall of the substrate;
an insulating layer overlaying the upper surface of the substrate; and
a conducting layer overlaying the insulating layer, wherein the conducting layer is electrically connected to the conducting pad and extends from the upper surface of the substrate to the sidewall of the substrate.

2. The chip package as claimed in claim 1, wherein at least a portion of the sidewall of the substrate inclines toward the upper surface of the substrate.

3. The chip package as claimed in claim 1, wherein the substrate comprises a semiconductor substrate with a dielectric layer and a passivation layer overlaying the semiconductor substrate, and a portion of the dielectric layer and the passivation layer is etched to expose a surface of the semiconductor substrate.

4. The chip package as claimed in claim 1, further comprising a circuit board, wherein the conducting layer is electrically connected to a contact pad on the circuit board through a conducting structure.

5. The chip package as claimed in claim 4, wherein the conducting structure comprises a solder ball or a bonding wire.

6. The chip package as claimed in claim 5, wherein the conducting structure is a solder ball, and the solder ball is located on a corner between the substrate and the circuit board.

7. The chip package as claimed in claim 5, wherein the conducting structure is a bonding wire, and the bonding wire is disposed on the conducting layer on the sidewall of the substrate.

8. The chip package as claimed in claim 7, wherein the bonding wire is disposed on the conducting layer on one of the bottoms of the recesses.

9. The chip package as claimed in claim 4, wherein the conducting structure is disposed between the circuit board and the upper surface of the substrate.

10. The chip package as claimed in claim 3, wherein the at least two recesses connect with each other, and at least a recess is formed from the semiconductor substrate.

11. The chip package as claimed in claim 1, wherein the device region or sensing region comprises a fingerprint recognition region.

12. The chip package as claimed in claim 1, wherein one of the recesses extends across an entire length of one side of the substrate.

13. The chip package as claimed in claim 12, wherein the recess further extends along at least a partial length of an adjacent side.

14. The chip package as claimed in claim 12, wherein the recess further extends along at least a partial length of two adjacent sides.

15. A method for forming a chip package, comprising:
  providing a substrate having an upper surface and a lower surface, wherein at least a device region or sensing region is defined in the substrate, and at least a conducting pad is located on the upper surface of the substrate;
  forming at least two recesses comprising a first recess and a second recess under the first recess extending from the upper surface towards the lower surface of the substrate, wherein sidewalls and bottoms of the recesses together form a sidewall of the substrate;
  forming an insulating layer overlying the upper surface of the substrate;
  forming a conducting layer overlying the insulating layer, wherein the conducting layer is electrically connected to the conducting pad and extends from the upper surface of the substrate to the sidewall of the substrate.

16. The method for forming a chip package as claimed in claim 15, further comprising thinning the substrate before the recesses are formed.

17. The method for forming a chip package as claimed in claim 15, further comprising:
  providing a circuit board having a contact pad;
  disposing the substrate overlying the circuit board; and
  forming a conducting structure, wherein the conducting structure is electrically connected to the contact pad and the conducting layer.

18. The method for forming a chip package as claimed in claim 17, wherein the conducting structure comprises a solder ball or a bonding wire.

19. The method for forming a chip package as claimed in claim 17, wherein the conducting structure is disposed between the circuit board and the upper surface of the substrate.

20. The method for forming a chip package as claimed in claim 19, wherein the conducting structure is electrically connected to the conducting layer directly on one of the bottoms of the recesses.

21. The method for forming a chip package as claimed in claim 15, wherein the substrate comprises a semiconductor substrate with a dielectric layer and a passivation layer overlying the semiconductor substrate.

22. The method for forming a chip package as claimed in claim 21, wherein a portion of the dielectric layer and the passivation layer is etched to expose a surface of the semiconductor substrate.

23. The method for forming a chip package as claimed in claim 22, wherein the recesses are formed by using an etching process, and at least a recess is formed from the semiconductor substrate.

24. The method for forming a chip package as claimed in claim 15, wherein one of the recesses extends across an entire length of one side of the substrate.

25. The method for forming a chip package as claimed in claim 24, wherein the recess further extends along at least a partial length of an adjacent side.

26. The method for forming a chip package as claimed in claim 24, wherein the recess further extends along at least a partial length of two adjacent sides.

27. The method for forming a chip package as claimed in claim 15, wherein a plurality of chip packages are defined on the substrate, each chip package comprising at least the device region or sensing region, wherein the method further comprising dicing the substrate to separate the plurality of chip packages.

* * * * *